(12) United States Patent
Shimizu (10) Patent No.: US 12,261,024 B2
(45) Date of Patent: Mar. 25, 2025

(54) PLASMA PROCESSING APPARATUS AND CLEANING METHOD (71) Applicant: Tokyo Electron Limited, Tokyo (JP)

(72) Inventor: Wataru Shimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 624 days.

(21) Appl. No.: 17/645,765

(22) Filed: Dec. 23, 2021

(65) Prior Publication Data
US 2022/0208524 A1 Jun. 30, 2022

(30) Foreign Application Priority Data

Dec. 25, 2020 (JP) ................... 2020-217258

(51) Int. Cl.
H01J 37/32 (2006.01)
(52) U.S. Cl.
CPC .. *H01J 37/32449* (2013.01); *H01J 37/32082* (2013.01); *H01J 37/32568* (2013.01); *H01J 37/32862* (2013.01)
(58) Field of Classification Search
CPC ........... H01J 37/32449; H01J 37/32082; H01J 37/32568; H01J 37/32862; H01J 37/32174; H01J 2237/334; B08B 7/00
See application file for complete search history.

(56) References Cited

U.S. PATENT DOCUMENTS

| | | | | |
|---|---|---|---|---|
| 2003/0119328 A1* | 6/2003 | Fujisato | ............. | C23C 16/4405 438/709 |
| 2010/0323501 A1* | 12/2010 | Yamazaki | ......... | H01J 37/32449 438/479 |
| 2016/0163515 A1* | 6/2016 | Maruyama | ........ | H01L 21/67069 438/758 |
| 2018/0108518 A1* | 4/2018 | Noro | ................... | C23C 16/4586 |

FOREIGN PATENT DOCUMENTS

| | | |
|---|---|---|
| JP | 2001-020076 A | 1/2001 |
| JP | 2002-280376 A | 9/2002 |
| JP | 2005-101309 A | 4/2005 |
| JP | 2006-066855 A | 3/2006 |
| JP | 2011-018938 A | 1/2011 |

* cited by examiner

*Primary Examiner* — Renan Luque
(74) *Attorney, Agent, or Firm* — Chrisman Gallo Tochtrop LLC (57) ABSTRACT An electrode is disposed within a chamber. Multiple gas discharge ports are disposed around the electrode to discharge a gas toward the electrode. A gas supply is configured to supply a processing gas to the multiple gas discharge ports. A radio frequency power supply is configured to supply a radio frequency power to the electrode to excite the processing gas into plasma. A controller is configured to control the radio frequency power supply to supply the radio frequency power to the electrode while controlling the gas supply to supply the processing gas to discharge the processing gas from the multiple gas discharge ports.

18 Claims, 5 Drawing Sheets

PLASMA PROCESSING APPARATUS AND CLEANING METHOD

CROSS-REFERENCE TO RELATED APPLICATION

This application claims the benefit of Japanese Patent Application No. 2020-217258 filed on Dec. 25, 2020, the entire disclosure of which is incorporated herein by reference.

TECHNICAL FIELD

The various aspects and embodiments described herein pertain generally to a plasma processing apparatus and a cleaning method.

BACKGROUND

Patent Document 1 describes a method of activating a cleaning gas with a plasma generator and removing a deposit on a wall of a chamber by introducing the activated cleaning gas from a lateral side of the chamber.
Patent Document 1: U.S. Patent Application Publication No. 2003/0119328

SUMMARY

In one exemplary embodiment, a plasma processing apparatus includes a chamber, an electrode, multiple gas discharge ports, a gas supply, a radio frequency power supply and a controller. The electrode is disposed within the chamber. The multiple gas discharge ports are disposed around the electrode to discharge a gas toward the electrode. The gas supply is configured to supply a processing gas to the multiple gas discharge ports. The radio frequency power supply is configured to supply a radio frequency power to the electrode to excite the processing gas into plasma. The controller is configured to control the radio frequency power supply to supply the radio frequency power to the electrode while controlling the gas supply to supply the processing gas to discharge the processing gas from the multiple gas discharge ports.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following description, an exemplary embodiment of a plasma processing apparatus and a cleaning method according to the present disclosure will be described with reference to the accompanying drawings. The plasma processing apparatus and the cleaning method according to the present disclosure are not limited by the present exemplary embodiment.

In a plasma processing apparatus, a deposit is deposited on an inner wall of a chamber. In Patent Document 1, as a technique of removing such a deposit, a cleaning gas is activated by a plasma generator, and the activated cleaning gas is introduced from a lateral side of the chamber. However, since the cleaning gas is activated by the plasma generator disposed outside the chamber and the activated cleaning gas is sent into the chamber through a pipeline, separation efficiency of the cleaning gas is not good, which results in low efficiency in removing the deposit.

For this reason, there is a demand for a technique enabling to remove the deposit adhering to the inner wall of the chamber efficiently.

Exemplary Embodiment

Figure 1:
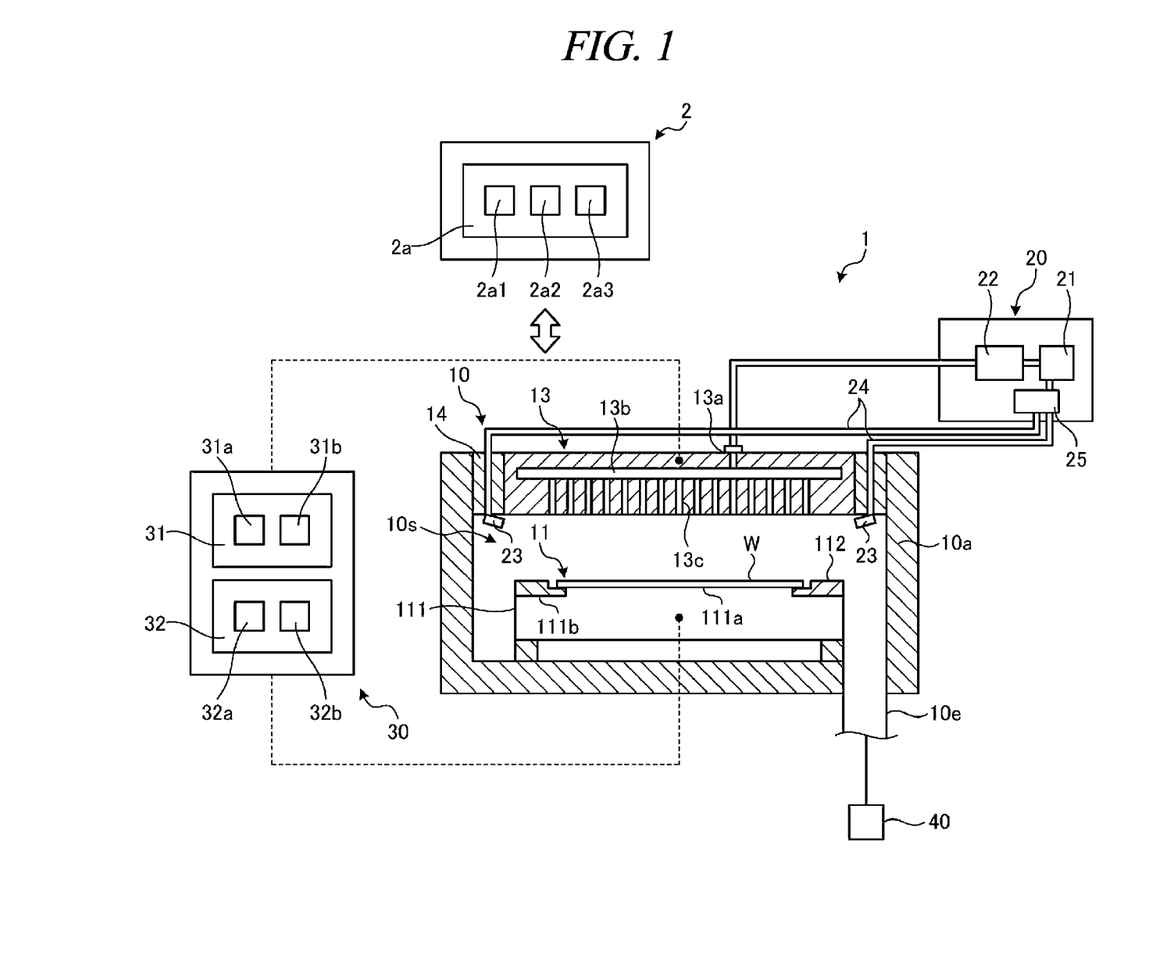
FIG. 1 is a diagram illustrating an example of a schematic configuration of a plasma processing system according to an exemplary embodiment.

<Apparatus Configuration>
An example of the plasma processing apparatus according to the present disclosure will be described. The present exemplary embodiment will be explained for an example where the plasma processing apparatus of the present disclosure is a plasma processing system having a system configuration. FIG. 1 is a diagram illustrating an example of a schematic configuration of the plasma processing system according to the exemplary embodiment.

Below, a configuration example of the plasma processing system will be described. The plasma processing system includes a capacitively coupled plasma processing apparatus 1 and a controller 2. The capacitively coupled plasma processing apparatus 1 includes a plasma processing chamber 10, a gas supply 20, a power supply 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed within the plasma processing chamber 10. The shower head 13 is disposed above the substrate support 11. In the exemplary embodiment, the shower head 13 constitutes at least a part of a ceiling of the plasma processing chamber 10. The plasma processing chamber 10 has a plasma processing space 10s confined by the shower head 13, a sidewall 10a of the plasma processing chamber 10, and the substrate support 11. The plasma processing chamber 10 has at least one gas supply port for supplying the at least one processing gas into the plasma processing space 10s, and at least one gas exhaust port for exhausting the gas from the plasma processing space 10s. The sidewall 10a is grounded. The shower head 13 and the substrate support 11 are electrically insulated from a housing of the plasma processing chamber 10. For example, the shower head 13 is supported by the plasma processing chamber 10 with an insulating member 14 such as ceramics therebetween. Accordingly, the plasma processing chamber 10 and the shower head 13 are electrically insulated.

The substrate support 11 includes a main body 111 and a ring assembly 112. The main body 111 has a central region (substrate supporting surface) 111a on which a substrate (wafer) W is supported, and an annular region (ring supporting surface) 111b on which the ring assembly 112 is supported. The annular region 111b of the main body 111 surrounds the central region 111a of the main body 111 when viewed from the top. The substrate W is placed on the central region 111a of the main body 111, and the ring assembly 112 is disposed on the annular region 111b of the main body 111 to surround the substrate W on the central region 111a of the main body 111. In the exemplary embodiment, the main body 111 includes a base and an electrostatic chuck. The base includes a conductive member. The conductive member of the base serves as a lower electrode. The electrostatic chuck is disposed on the base. A top surface of the electrostatic chuck has the substrate supporting surface 111a. The ring assembly 112 includes one or more annular members. At least one of the one or more annular members is an edge ring. Further, although not shown, the substrate support 11 may include a temperature control module configured to adjust at least one of the electrostatic chuck, the ring assembly 112 and the substrate to a target temperature. The temperature control module may include a heater, a heat transfer medium, a flow path, or a combination thereof. In the flow path, a heat transfer fluid such as brine or a gas flows. Moreover, the substrate support 11 may also include a heat transfer gas supply configured to supply a heat transfer gas into a gap between a rear surface of the substrate W and the substrate supporting surface 111a.

The shower head 13 is configured to introduce at least one processing gas from the gas supply 20 into the plasma processing space 10s. The shower head 13 has at least one gas supply opening 13a, at least one gas diffusion chamber 13b, and a plurality of gas inlet openings 13c. The processing gas supplied to the gas supply opening 13a passes through the gas diffusion chamber 13b to be introduced into the plasma processing space 10s from the plurality of gas inlet openings 13c. Further, the shower head 13 includes a conductive member. The conductive member of the shower head 13 serves as an upper electrode. Also, in addition to the shower head 13, the gas introduction unit may further include one or more side gas injectors (SGI) mounted to one or more openings formed in the sidewall 10a.

The gas supply 20 may include at least one gas source 21 and at least one flow rate controller 22. In the exemplary embodiment, the gas supply 20 is configured to supply at least one processing gas from the corresponding gas source 21 to the shower head 13 via the corresponding flow rate controller 22. Each flow rate controller 22 may include, for example, a mass flow controller or a pressure control type flow rate controller. In addition, the gas supply 20 may also include one or more flow rate modulation devices configured to modulate or pulse a flow rate of at least one processing gas.

Within the plasma processing chamber 10, a multiple number of gas discharge ports 23 are provided around the shower head 13. In the exemplary embodiment, the gas discharge ports 23 are provided at the insulating member 14 surrounding the shower head 13.

Figure 2:
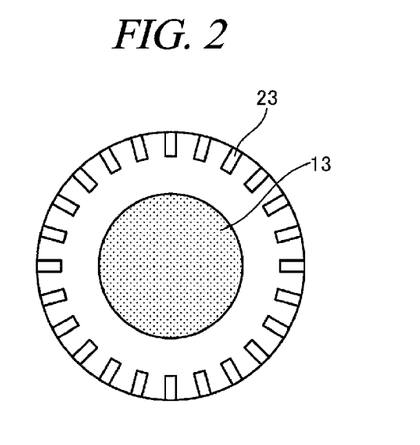
FIG. 2 is a diagram illustrating an example of arrangement of gas discharge ports according to the exemplary embodiment.
Figure 3A:
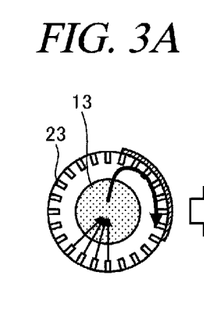
FIG. 3A to FIG. 3D are diagrams for describing an example of a discharging sequence of a cleaning gas according to the exemplary embodiment.
Figure 3B:
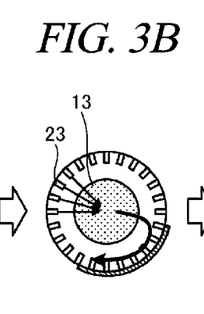
Figure 3C:
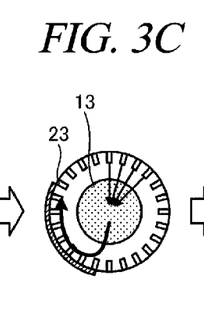
Figure 3D:
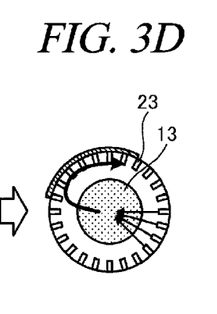

FIG. 2 is a diagram illustrating an example of arrangement of the gas discharge ports 23 according to the exemplary embodiment. The gas discharge ports 23 are disposed to surround the shower head 13 while being spaced apart from each other along the entire circumference of the shower head 13. In the exemplary embodiment, twenty four gas discharge ports 23 are provided around the shower head 13 at a regular interval therebetween. Each gas discharge port 23 is directed toward a center side so as to discharge a gas toward an electrode side of the shower head 13.

Reference is made back to FIG. 1. The gas discharge ports 23 are respectively connected to the gas supply 20. The gas supply 20 supplies a gas to each gas discharge port 23. For example, the gas supply 20 supplies a cleaning gas for cleaning to each gas discharge port 23. The gas supply 20 is capable of controlling a flow rate of the gas to be supplied to each gas discharge port 23. In the exemplary embodiment, the gas supply 20 is connected to the gas discharge ports 23 via individual pipelines 24. Each pipeline 24 is provided with a flow rate controller 25. The gas supply 20 is configured to supply the cleaning gas from the corresponding gas source 21 to each gas discharge port 23 via the corresponding flow rate controller 25. The gas supply 20 is capable of controlling the flow rate of the gas to be supplied to each gas discharge port 23 by controlling the flow rate of the gas with the corresponding flow rate controller 25.

The power supply 30 includes an RF power supply 31 coupled to the plasma processing chamber 10 via at least one impedance matching circuit. The RF power supply 31 is configured to supply at least one RF signal (RF power) such as a source RF signal or a bias RF signal to the conductive member of the substrate support 11 and/or the conductive member of the shower head 13. Accordingly, plasma is formed from the at least one processing gas supplied into the plasma processing space 10s. Thus, the RF power supply 31 may serve as at least a part of a plasma forming unit configured to form the plasma from the one or more processing gases in the plasma processing chamber 10. Further, by supplying the bias RF signal to the conductive member of the substrate support 11, a bias potential is generated in the substrate W, and ion components in the formed plasma can be attracted into the substrate W.

In the exemplary embodiment, the RF power supply 31 includes a first RF generator 31a and a second RF generator 31b. The first RF generator 31a is coupled to the conductive member of the substrate support 11 and/or the conductive member of the shower head 13 via at least one impedance matching circuit to generate the source RF signal (source RF power) for plasma formation. In the exemplary embodiment, the source RF signal has a frequency in the range from 13 MHz to 150 MHz. In the exemplary embodiment, the first RF generator 31a may be configured to generate a plurality of source RF signals having different frequencies. The generated one or more source RF signals are supplied to the conductive member of the substrate support 11 and/or the conductive member of the shower head 13. The second RF generator 31b is coupled to the conductive member of the substrate support 11 via at least one impedance matching circuit, and is configured to generate the bias RF signal (bias RF power). In the exemplary embodiment, the bias RF signal has a lower frequency than the source RF signal. In the exemplary embodiment, the bias RF signal has a frequency ranging from 400 kHz to 13.56 MHz. In the exemplary embodiment, the second RF generator 31b may be configured to generate a plurality of bias RF signals having different frequencies. The generated one or more bias RF signals are supplied to the conductive member of the substrate support 11. Further, in various exemplary embodiments, at least one of the source RF signal and the bias RF signal may be pulse-modulated.

The power supply 30 may also include a DC power supply 32 coupled to the plasma processing chamber 10. The DC power supply 32 includes a first DC generator 32a and a second DC generator 32b. In the exemplary embodiment, the first DC generator 32a is connected to the conductive member of the substrate support 11 and is configured to generate a first DC signal. The generated first DC signal is applied to the conductive member of the substrate support 11. In the exemplary embodiment, the first DC signal may be applied to another electrode, such as an electrode within the electrostatic chuck. In the exemplary embodiment, the second DC generator 32b is connected to the conductive member of the shower head 13 and is configured to generate a second DC signal. The generated second DC signal is applied to the conductive member of the shower head 13. In various exemplary embodiments, at least one of the first DC signal and the second DC signal may be pulse-modulated. In addition, the first and second DC generators 32a and 32b may be provided in addition to the RF power supply 31, or the first DC generator 32a may be provided instead of the second RF generator 31b.

The exhaust system 40 may be connected to, for example, a gas exhaust port 10e provided at a bottom of the plasma processing chamber 10. The exhaust system 40 may include a pressure control valve, and a vacuum pump. An internal pressure of the plasma processing space 10s is adjusted by the pressure control valve. The vacuum pump may include a turbo molecular pump, a dry pump, or a combination thereof.

The controller 2 processes computer-executable instructions that cause the plasma processing apparatus 1 to perform various processes described in the present disclosure. The controller 2 may be configured to control the individual components of the plasma processing apparatus 1 to perform the various processes described herein. In the exemplary embodiment, a part or the whole of the controller 2 may be included in the plasma processing apparatus 1. The controller 2 may include, for example, a computer 2a. The computer 2a may include, for example, a processor (CPU: Central Processing Unit) 2a1, a storage 2a2, and a communication interface 2a3. The processor 2a1 may be configured to perform various control operations based on a program stored in the storage 2a2. The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

However, as mentioned above, deposits are deposited on the inner wall of the plasma processing chamber 10 in the plasma processing apparatus 1. The deposits include byproducts produced by a plasma processing, ash by heat, and so forth.

These deposits in the plasma processing chamber 10 are removed by a cleaning processing of a cleaning method according to the exemplary embodiment. The plasma processing system according to the exemplary embodiment performs the cleaning processing of removing the deposits in the plasma processing chamber 10 under the control of the controller 2. This cleaning processing may be performed at any time during a substrate processing. For example, in the plasma processing system, there may be performed a processing of restoring a state within the plasma processing chamber 10 by dry cleaning or the like after the substrate processing is performed on a preset number of substrates W. The controller 2 may perform the cleaning processing of the cleaning method according to the exemplary embodiment during the dry cleaning on the inside of the plasma processing chamber 10 or following the dry cleaning.

When performing the cleaning processing of the cleaning method according to the exemplary embodiment, the controller 2 controls the gas supply 20 to supply a cleaning gas to the plurality of gas discharge ports 23 from the gas supply 20, thus allowing the cleaning gas to be discharged from the gas discharge ports 23. Further, the controller 2 controls, according to the supply of the cleaning gas, the first RF generator 31a and the second RF generator 31b to supply the source RF signal for plasma formation to the conductive member of the shower head 13. Also, the controller 2 may perform a control so that the bias RF signal is supplied to the conductive member of the substrate support 11.

Each gas discharge port 23 is directed toward the center side. Accordingly, when the cleaning gas discharged from the gas discharge port 23 passes through a space between the shower head 13 and the substrate support 11, the cleaning gas is excited into plasma to be activated. By allowing the cleaning gas to pass through the space between the shower head 13 and the substrate support 11, a large number of active species can be efficiently obtained from the cleaning gas. The activated cleaning gas reaches the inner wall of the plasma processing chamber 10. Accordingly, the large number of active species can reach the inner wall of the plasma processing chamber 10. As a result, the deposits adhering to the inner wall of the plasma processing chamber 10 can be efficiently removed.

The controller 2 controls the supply of the cleaning gas from the gas supply 20 so that the cleaning gas is discharged in units of one or a plurality of adjacent gas discharge ports 23 in sequence. Further, the controller 2 controls the supply of the cleaning gas from the gas supply 20 so that the gas discharge ports 23 from which the cleaning gas is discharged are sequentially switched along the circumference of the shower head 13. By way of example, the controller 2 controls the supply of the cleaning gas from the gas supply 20 such that the cleaning gas is discharged from, among the plurality of gas discharge ports 23, each set of a predetermined number of adjacent gas discharge ports 23 along the circumference of the shower head 13 in sequence.

FIG. 3A to FIG. 3D are diagrams for describing an example discharging sequence of the cleaning gas according to the exemplary embodiment. FIG. 3A to FIG. 3D show the switching of the gas discharge ports 23 for discharging the cleaning gas. In FIG. 3A to FIG. 3D, the cleaning gas is discharged from different sets of four adjacent gas discharge ports 23. When the discharged cleaning gas passes through the shower head 13 provided at the center, it is excited into plasma to be activated, and reaches the inner wall of the plasma processing chamber 10 opposite to the gas discharge ports 23. Then, the cleaning gas changes its flow along the inner wall of the plasma processing chamber 10, so that a flow velocity of the gas increases. Since the flow velocity of the gas on the opposite side to the gas discharge ports 23 increases, a removing rate by the cleaning gas is increased, so that the deposits adhering to the inner wall can be removed more efficiently.

The controller 2 controls the supply of the cleaning gas from the gas supply 20 so that the gas discharge ports 23 from which the cleaning gas is discharged are switched in sequence along the circumference of the shower head 13. As a result, as shown in the order of FIG. 3A to FIG. 3D, the gas discharge ports 23 from which the cleaning gas is discharged are switched in sequence along the circumference of the shower head 13. Accordingly, a swirl flow of the cleaning gas swirling along the inner wall of the plasma processing chamber 10 can be generated, and the attached deposits can be more efficiently removed from the inner wall all around the perimeter thereof.

The cleaning gas may be any of various kinds as long as it is capable of removing the deposits. For example, if the deposit is an organic product generated from an etching gas during an etching process of the substrate W, the cleaning gas may be an oxygen-containing gas such as $O_2$, CO or $CO_2$. Further, if the deposit is an organic film containing a metal such as tungsten (W) or titanium (Ti), the cleaning gas may be an oxygen-containing gas such as $O_2$, CO or $CO_2$, or a gas prepared by adding a halogen-containing gas such as $CF_4$ or $Cl_2$ to the oxygen-containing gas. Furthermore, if the deposit is one generated from the etching of a metal such as ruthenium (Ru) or tantalum (Ta), the cleaning gas may be a methanol ($CH_3OH$) gas.

Figure 4A:
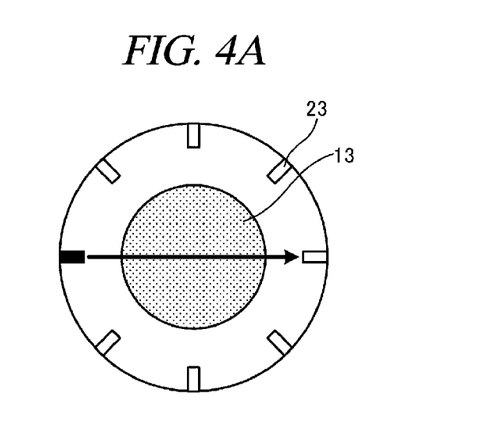
FIG. 4A is a diagram illustrating another example of the arrangement of the gas discharge ports according to the exemplary embodiment.
Figure 4B:
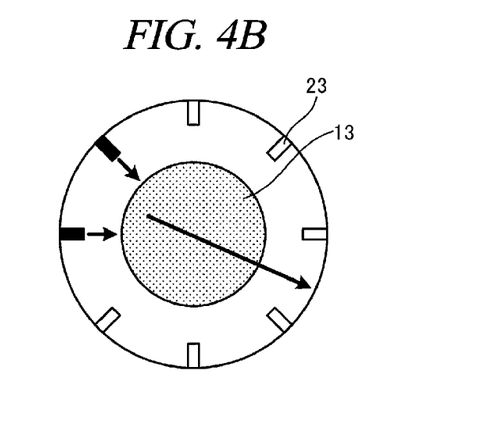
FIG. 4B is a diagram illustrating yet another example of the arrangement of the gas discharge ports according to the exemplary embodiment.
Figure 4C:
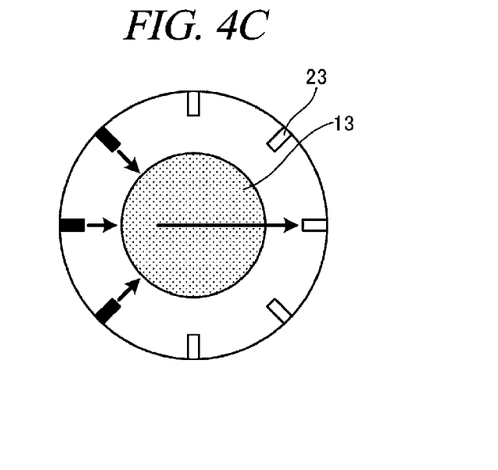
FIG. 4C is a diagram illustrating still yet another example of the arrangement of the gas discharge ports according to the exemplary embodiment.

Further, the above exemplary embodiment has been described for the example where the twenty four gas discharge ports 23 are provided around the shower head 13 and the cleaning gas is discharged from each set of the four gas discharge ports 23. However, the exemplary embodiment is not limited thereto. The number of the gas discharge ports 23 provided around the shower head 13 may not be particularly limited. In addition, the number of the gas discharge ports 23 that discharge the cleaning gas at one time may not be particularly limited, either. FIG. 4A to FIG. 4C are diagrams showing another example of the arrangement of the gas discharge ports 23 according to the exemplary embodiment. In FIG. 4A to FIG. 4C, eight gas discharge ports 23 are provided around the shower head 13. In FIG. 4A, the cleaning gas is discharged from the gas discharge ports 23 one by one. In FIG. 4B, the cleaning gas is discharged from two gas discharge ports 23 at one time. In FIG. 4C, the cleaning gas is discharged from three gas discharge ports 23 at one time.

Figure 5A:
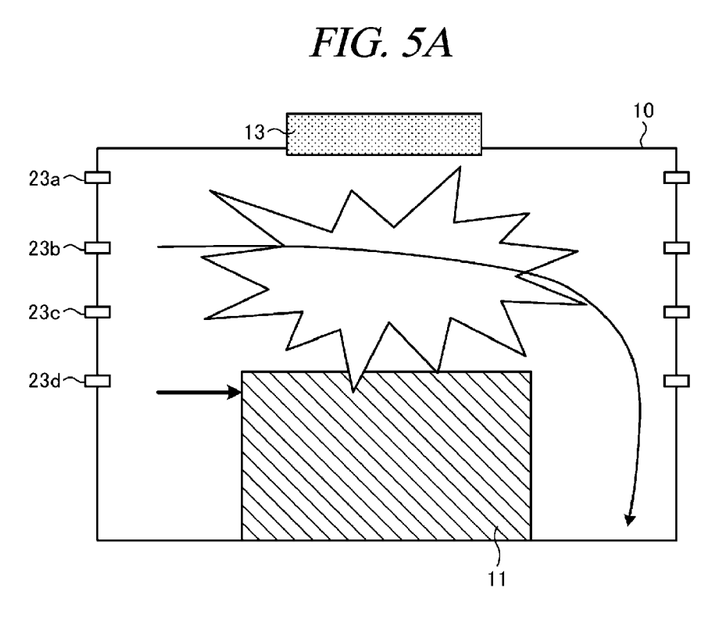
FIG. 5A is a diagram illustrating still yet another example of the arrangement of the gas discharge ports according to the exemplary embodiment.
Figure 5B:
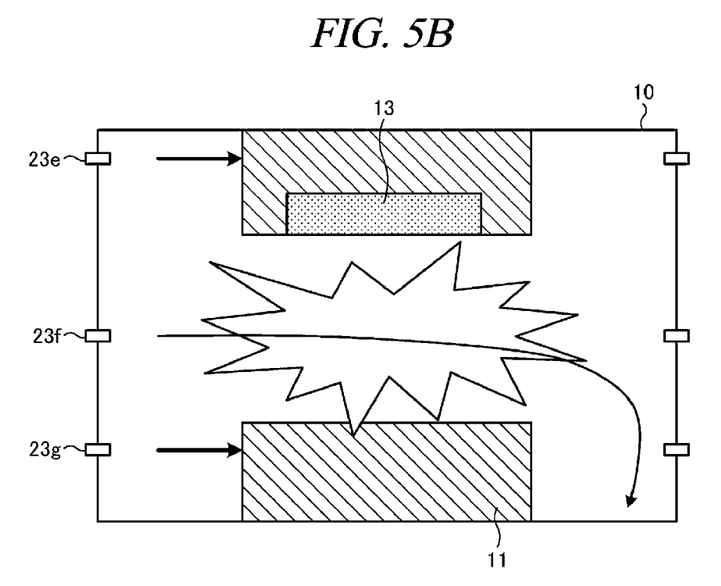
FIG. 5B is a diagram illustrating still yet another example of the arrangement of the gas discharge ports according to the exemplary embodiment.
Figure 6:
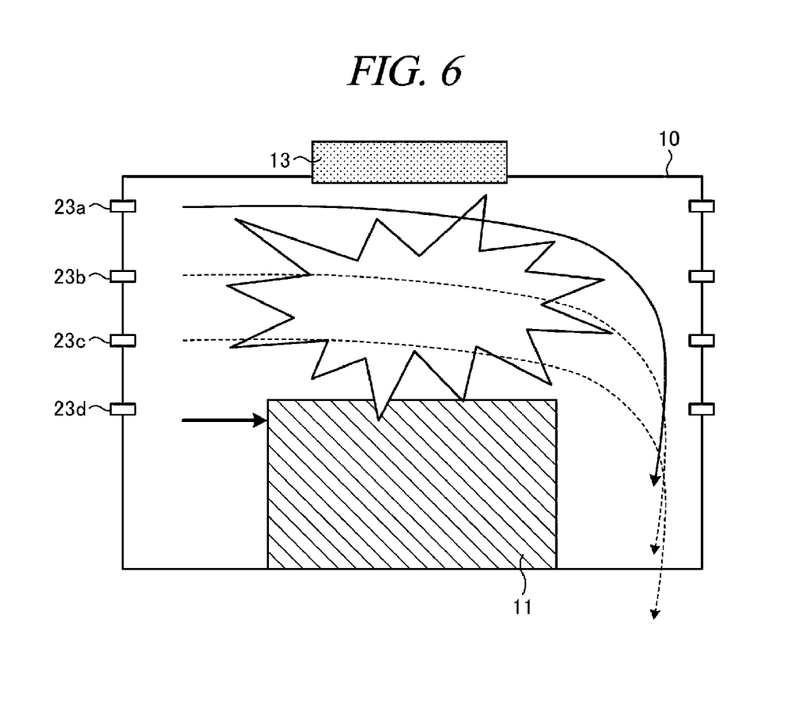
FIG. 6 is a diagram for describing another example of the discharging sequence of the cleaning gas according to the exemplary embodiment.

In addition, although the above exemplary embodiment has been described for the example where the gas discharge ports 23 are provided at the insulating member 14 surrounding the shower head 13, the exemplary embodiment is not limited thereto. The gas discharge ports 23 may be provided anywhere. By way of example, the gas discharge ports 23 may be provided at the inner wall of the plasma processing chamber 10. Besides, the gas discharge ports 23 may be disposed at different heights at the inner wall of the plasma processing chamber 10. FIG. 5A and FIG. 5B are diagrams showing another example of the arrangement of the gas discharge ports 23 according to the exemplary embodiment. In FIG. 5A and FIG. 5B, the gas discharge ports 23 are provided at the inner wall of the plasma processing chamber 10. In FIG. 5A, the shower head 13 constitutes a ceiling plate of the plasma processing chamber 10. Gas discharge ports 23a to 23d are provided at different heights at an inner sidewall of the plasma processing chamber 10. In FIG. 5B, the shower head 13 protrudes downwards from the ceiling plate of the plasma processing chamber 10. Gas discharge ports 23e to 23g are provided at different heights at the inner sidewall of the plasma processing chamber 10. It is desirable to provide the gas discharge ports 23 at the heights between the shower head 13 and the substrate support 11 so that the discharged cleaning gas passes through the space between the shower head 13 and the substrate support 11. For example, in FIG. 5A, it is desirable to arrange the gas discharge ports 23 at the positions of the gas discharge ports 23a to 23c. In FIG. 5B, it is desirable to arrange the gas discharge ports 23 at the position of the gas discharge port 23f. If the multiple gas discharge ports 23 are arranged at the different heights, the controller 2 may control the supply of the cleaning gas from the gas supply 20 such that the cleaning gas is discharged from the respective gas discharge ports 23 in the order of the highest position or the lowest position. FIG. 6 is a diagram for describing another example of the sequence of discharging the cleaning gas according to the exemplary embodiment. In FIG. 6, the gas discharge ports 23a to 23d are provided at different heights at the inner sidewall of the plasma processing chamber 10, the same as in FIG. 5A. The controller 2 may control the supply of the cleaning gas from the gas supply 20 so that the cleaning gas is discharged in the order of the gas discharge ports 23a, 23b, 23c and 23d. For example, as for the gas discharge ports 23a to 23d provided around the shower head 13 at the different heights, the controller 2 controls the supply of the cleaning gas from the gas supply 20 such that the cleaning gas is discharged along the circumference of the shower head 13 in sequence, starting from the gas discharge port 23 at the highest position.

Further, as illustrated in FIG. 5A and FIG. 5B, the cleaning gas discharged from the gas discharge ports 23 is excited into the plasma to be activated when it passes through the shower head 13 at the center, and reaches the inner wall of the plasma processing chamber 10 on the opposite side to the gas discharge ports 23. At this time, since the cleaning gas having passed through the plasma directly reaches the inner wall of the plasma processing chamber 10 along the flow of the gas, deactivation of the activated cleaning gas can be minimized. Therefore, since more activated cleaning gas can be supplied with the increased flow velocity of the gas as mentioned above, the removing rate by the cleaning gas is improved, so that the deposits adhering to the inner wall can be removed more efficiently.

Further, as stated above, a part or the whole of the controller 2 may be included in the plasma processing apparatus 1.

As described above, the plasma processing apparatus 1 according to the exemplary embodiment includes the plasma processing chamber 10 (chamber), the shower head 13 (electrode), the multiple number of gas discharge ports 23, the gas supply 20, the RF power supply 31 (radio frequency power supply), and the controller 2. The shower head 13 is disposed within the plasma processing chamber 10. The multiple number of gas discharge ports 23 are arranged around the shower head 13 to discharge the gas toward the shower head 13 side. The gas supply 20 supplies the cleaning gas as the processing gas to the gas discharge ports 23. The RF power supply 31 supplies the radio frequency power to the shower head 13 to excite the cleaning gas into the plasma. During the cleaning processing, the controller 2 controls the RF power supply 31 to supply the radio frequency power to the shower head 13 while controlling the gas supply 20 to supply the cleaning gas, thus allowing the cleaning gas to be discharged from the gas discharge ports 23. Accordingly, the plasma processing apparatus 1 is capable of improving the efficiency of removing the deposits adhering to the inner wall of the plasma processing chamber 10.

Furthermore, the controller 2 controls the supply of the cleaning gas from the gas supply 20 so that the cleaning gas is discharged in the units of one or the plurality of adjacent gas discharge ports 23 in sequence. Accordingly, in the plasma processing apparatus 1, since the flow velocity of the gas at the inner wall of the plasma processing chamber 10 on the opposite side to the gas discharge ports 23 is increased, the removing rate by the cleaning gas is improved. As a consequence, the deposits adhering to the inner wall can be removed more efficiently.

In addition, the controller 2 controls the supply of the cleaning gas from the gas supply 20 so that the gas discharge ports 23 through which the cleaning gas is discharged are switched in sequence along the circumference of the shower head 13. Accordingly, the plasma processing apparatus 1 may generate the swirl flow of the cleaning gas swirling along the inner wall of the plasma processing chamber 10, thus capable of removing the deposits adhering to the entire perimeter of the inner wall more efficiently.

Further, the multiple number of gas discharge ports 23 are disposed around the shower head 13. Accordingly, in the plasma processing apparatus 1, the large number of active species can be obtained from the cleaning gas, so that the efficiency of removing the deposits adhering to the inner wall of the plasma processing chamber 10 can be improved.

Moreover, the multiple number of gas discharge ports 23 are arranged so as to allow the cleaning gas discharged therefrom to pass through the space between the shower head 13 and the substrate support 11. In this way, since the cleaning gas passes through the space between the shower head 13 and the substrate support 11, the large number of active species can be efficiently obtained from the cleaning gas.

In addition, the plurality of gas discharge ports 23 are further arranged at the different heights at the inner wall of the plasma processing chamber 10. Accordingly, in the plasma processing apparatus 1, a region where the flow velocity of the gas increases can be changed in a height direction of the inner wall of the plasma processing chamber 10, so that the deposits adhering to the inner wall can be removed more efficiently.

Furthermore, during the dry cleaning of the inside of the plasma processing chamber 10 or following the dry cleaning, the controller 2 controls the RF power supply 31 to supply the radio frequency power to the shower head 13 while controlling the gas supply 20 to supply the cleaning gas so that the cleaning gas is discharged from the gas discharge ports 23. Accordingly, in the plasma processing apparatus 1, the deposits adhering to the inner wall of the plasma processing chamber 10 can be removed according to the timing of the dry cleaning.

So far, the exemplary embodiment has been described. It should be noted that the above-described exemplary embodiment is illustrative in all aspects and is not anyway limiting. In fact, the above-described exemplary embodiment can be embodied in various forms. The above-described exemplary embodiment may be omitted, replaced and modified in various ways without departing from the scope and the spirit of claims.

For example, although the above exemplary embodiment has been described for the example where the plasma processing is performed on the semiconductor wafer as the substrate W, the substrate W is not limited thereto. The substrate W may be any of various kinds.

In addition, in the above-described exemplary embodiment, the radio frequency power is supplied from the RF power supply 31 to the shower head 13 while the cleaning gas is being discharged from the gas discharge ports 23 during the cleaning processing. However, the present disclosure is not limited thereto. The plasma processing apparatus 1 may supply the radio frequency power to the shower head 13 from the RF power supply 31 while discharging various kinds of gases for use in the plasma processing, e.g., process gas, from the gas discharge ports 23 as the processing gas, and perform the plasma processing and cleaning by the plasma formed from the processing gas. By way of example, the controller 2 may supply the power from the RF power supply 31 to the shower head 13 while discharging the processing gas from the gas discharge ports 23 by supplying the processing gas from the gas supply 20.

Moreover, the above exemplary embodiment has been described for the example where the plasma etching is performed as the plasma processing, the exemplary embodiment is not limited thereto. The plasma processing may be any processing using plasma.

Here, it should be noted that the above-described exemplary embodiment is illustrative in all aspects and is not anyway limiting. In fact, the above-described exemplary embodiment can be embodied in various forms. Further, the above-described exemplary embodiments may be omitted, replaced and modified in various ways without departing from the scope and the spirit of claims According to the exemplary embodiment, it is possible to efficiently remove the deposit adhering to the inner wall of the chamber.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A plasma processing apparatus, comprising:
a chamber;
an electrode disposed within the chamber;
multiple gas discharge ports provided at an insulating member surrounding the electrode and disposed to surround the electrode while being spaced apart from each other along an entire circumference of the electrode to discharge a gas toward a center side of the electrode;
a gas supply configured to supply a processing gas to the multiple gas discharge ports;
a radio frequency power supply configured to supply a radio frequency power to the electrode to excite the processing gas into plasma; and
a controller configured to control the radio frequency power supply to supply the radio frequency power to the electrode while controlling the gas supply to supply the processing gas, such that the processing gas is discharged from the multiple gas discharge ports in a manner where the gas discharge ports through which the processing gas is discharged are switched along the circumference of the electrode.

2. The plasma processing apparatus of claim 1, wherein the controller controls the supply of the processing gas from the gas supply such that the processing gas is discharged in units of one or a multiplicity of adjacent gas discharge ports in sequence.

3. The plasma processing apparatus of claim 1, wherein the electrode is a shower head disposed above a substrate support configured to support a substrate, the electrode being configured to discharge a process gas of a substrate processing.

4. The plasma processing apparatus of claim 3, wherein the multiple gas discharge ports are arranged so as to allow the discharged processing gas to pass through a space between the shower head and the substrate support.

5. The plasma processing apparatus of claim 1, wherein the processing gas is a cleaning gas configured to clean an inside of the chamber by the plasma of the processing gas.

6. The plasma processing apparatus of claim 1, wherein the controller controls, during dry cleaning of an inside of the chamber or following the dry cleaning, the radio frequency power supply to supply the radio frequency power to the electrode while controlling the processing gas supply to supply the processing gas to discharge the processing gas from the multiple gas discharge ports.

7. The plasma processing apparatus of claim 1, wherein the multiple gas discharge ports are connected to the gas supply via individual pipelines through the insulating member.

8. The plasma processing apparatus of claim 1, wherein the controller controls the supply of the processing gas from the gas supply such that the processing gas is discharged from the multiple gas discharge ports to be reached to an inner wall of the chamber opposite to the multiple gas discharge ports.

9. A plasma processing apparatus, comprising:
a chamber;
an electrode disposed within the chamber;
multiple gas discharge ports disposed around the electrode to discharge a gas toward the electrode;
a gas supply configured to supply a processing gas to the multiple gas discharge ports;
a radio frequency power supply configured to supply a radio frequency power to the electrode to excite the processing gas into plasma; and
a controller configured to control the radio frequency power supply to supply the radio frequency power to the electrode while controlling the gas supply to supply the processing gas to discharge the processing gas from the multiple gas discharge ports,
wherein the multiple gas discharge ports are further disposed at different heights at a sidewall of the chamber.

10. The plasma processing apparatus of claim 9, wherein the controller controls the supply of the processing gas such that the processing gas is discharged from the multiple gas discharge ports in an order of a highest position or a lowest position.

11. The plasma processing apparatus of claim 9, wherein the processing gas is a cleaning gas configured to clean an inside of the chamber by the plasma of the processing gas.

12. The plasma processing apparatus of claim 9, wherein the controller controls, during dry cleaning of an inside of the chamber or following the dry cleaning, the radio frequency power supply to supply the radio frequency power to the electrode while controlling the processing gas supply to supply the processing gas to discharge the processing gas from the multiple gas discharge ports.

13. A cleaning method of a plasma processing apparatus, wherein the plasma processing apparatus comprises:
a chamber;
an electrode disposed within the chamber;
multiple gas discharge ports provided at an insulating member surrounding the electrode and disposed to surround the electrode while being spaced apart from each other along an entire circumference of the electrode to discharge a gas toward a center side of the electrode;
a gas supply configured to supply a processing gas to the multiple gas discharge ports; and
a radio frequency power supply configured to supply a radio frequency power to the electrode to excite the processing gas into plasma, and
wherein the cleaning method comprises controlling the radio frequency power supply to supply the radio frequency power to the electrode while controlling the processing gas supply to supply the processing gas, such that the processing gas is discharged from the multiple gas discharge ports in a manner where the gas discharge ports through which the processing gas is discharged are switched along the circumference of the electrode.

14. The cleaning method of the plasma processing apparatus of claim 13, wherein the multiple gas discharge ports are connected to the gas supply via individual pipelines through the insulating member.

15. The cleaning method of the plasma processing apparatus of claim 13, wherein the cleaning method comprises controlling the supply of the processing gas from the gas supply such that the processing gas is discharged in units of one or a multiplicity of adjacent gas discharge ports in sequence.

16. The cleaning method of the plasma processing apparatus of claim 13, wherein the cleaning method comprises controlling the supply of the processing gas from the gas supply such that the processing gas is discharged from the multiple gas discharge ports to be reached to an inner wall of the chamber opposite to the multiple gas discharge ports.

17. The cleaning method of the plasma processing apparatus of claim 13,
wherein the processing gas is a cleaning gas configured to clean an inside of the chamber by the plasma of the processing gas.

18. The cleaning method of the plasma processing apparatus of claim 13,
wherein the cleaning method comprises controlling, during dry cleaning of an inside of the chamber or following the dry cleaning, the radio frequency power supply to supply the radio frequency power to the electrode while controlling the processing gas supply to supply the processing gas to discharge the processing gas from the multiple gas discharge ports.

* * * * *